United States Patent
Patel et al.

[11] Patent Number: 6,037,834
[45] Date of Patent: Mar. 14, 2000

[54] METHOD AND APPARATUS FOR AUTOMATIC GAIN CONTROL WITH IMPROVED RESPONSE TIME AND STABILITY

[75] Inventors: Bhasker P. Patel, Laguna Niguel; Kenneth E. Garey, Irvine, both of Calif.

[73] Assignee: Conexant Systems, Inc., Newport Beach, Calif.

[21] Appl. No.: 09/036,397

[22] Filed: Mar. 6, 1998

[51] Int. Cl.[7] .................................................. G06G 7/12
[52] U.S. Cl. ........................ 327/560; 327/363; 327/563; 330/260; 330/291
[58] Field of Search .................................. 327/560–563, 327/363; 330/254, 260, 278, 282, 291–294

*Primary Examiner*—Kenneth B. Wells
*Attorney, Agent, or Firm*—Price, Gess & Ubell

[57] ABSTRACT

The AGC circuit and method especially applicable in circuits where fast response and stability of the system is necessary, such as where input signals are speech patterns. A gain feedback loop repeatedly adapts the gain and a long term average energy $E_{mean}$ of the output signal until it approaches a predetermined level. In each pass through the gain feedback loop the long term average energy $E_{mean}$ is increased by a gain compensation parameter directly proportional to a gain change, thereby rapidly adapting the long term average energy $E_{mean}$ to converge to the predetermined level.

6 Claims, 4 Drawing Sheets

METHOD AND APPARATUS FOR AUTOMATIC GAIN CONTROL WITH IMPROVED RESPONSE TIME AND STABILITY

BACKGROUND OF THE INVENTION

1. Field of the Invention

The present invention relates generally to Automatic Gain Control (AGC) circuits and more specifically pertains to AGC circuits with improved response time and stability.

2. Description of Related Art

AGC circuits are designed to maintain a desired signal level at the output of the circuit. To achieve this goal, the algorithm used by the AGC circuit has to adapt to variations in the input signal of the circuit. Typically, there is a tradeoff between responsiveness and stability of the system. Thus, conventional AGC circuits are either sluggish or become unstable under certain circumstances.

Most AGC algorithms are based on calculation of a long term average energy ($E_{mean}$) of the output signal of the AGC circuit, computed over several time frames. The goal of a circuit designer is to maintain, on the output of the circuit, the long term average energy $E_{mean}$ at, or close to, a target reference energy level ($E_{ref}$). This is accomplished in a feedback loop of the AGC circuit where the input signal is multiplied with an updated value of gain estimate (G) until the energy level of the output signal approaches the target reference energy level $E_{ref}$.

The gain estimate G of the AGC circuit is varied as a function of a difference $\Delta = E_{ref} - E_{mean}$, which is weighted with a proportionality constant. The value of the proportionality constant is one of the factors affecting the responsiveness of the system. Another factor is dependent on the way the long term average energy $E_{mean}$ is calculated. If the calculation of $E_{mean}$ involves input signals from many past time frames, the AGC circuit will be slow in incorporating changes in the signal. This may be somewhat desirable, since the AGC circuit should not react too rapidly to short term changes. On the other hand, if the system is too slow with incorporation of the changes, the AGC circuit may not be able to boost or attenuate the input signal in reasonable time. Therefore, the AGC circuit parameters should be chosen carefully to ensure both the stability and responsiveness of the system.

A block diagram of a conventional AGC circuit is presented in FIG. 1. The elements of the block diagram can be presented with following equations, applicable in linear or dB domain:

$$E_{mean}' = (1-\beta) E_{mean} + \beta R_0 \quad (1)$$

$$\Delta = E_{ref} - E_{mean}' \quad (2)$$

$$\epsilon = f(\Delta) = \Delta\gamma_1 + \text{sign}(\Delta)\Delta^2\gamma_q \quad (3)$$

$$G' = G + \epsilon \quad (4)$$

where $R_0$ is energy of a current frame of the input signal, $\beta$ is an averaging constant, $\epsilon$ is a gain change, G is an estimated gain, $\gamma_1$, is a coefficient representing linear slew rate and $\gamma_q$ is a coefficient representing quadratic slew rate. $E_{mean}$ and G are calculated recursively in the feedback loop. The initial value of G and $E_{mean}$ is set to zero dB, which is unity gain in linear domain. The gain change $\epsilon$ is included in Eq. (1) indirectly, as a function of the averaging constant $\beta$.

FIG. 1 represents the elements of the AGC circuit 10 observed during one frame. An input signal x(n) 12, already converted into digital form, is updated in a feedback loop 16 and exits as an output signal y(n) 13. The energy of the frame $R_0$ 14, corresponding to the input signal x(n) 12, is calculated in a circuit element 14. The value of $R_0$ 14 is used in a circuit element 17 of the feedback loop 16 to calculate a new estimated value of $E_{mean}'$ 18 according to Eq. (1). The difference $\Delta$ 20 is obtained according to Eq. (2), in a summing element 19 which subtracts $E_{ref}$ 15 from the new estimated value of the $E_{mean}'$ 18. The gain change $\epsilon$ 22 is obtained according to Eq. (3) in a circuit element 21, and a new value of estimated gain G' 24 in a circuit element 23 according to Eq. (4). The output signal y(n) 13, which is a new value of the input signal x(n) 12, is obtained in a multiplying element 26 of the feedback loop 16, which multiplies the new value of the estimated gain G' 24 with the input signal x(n) 12. Each circuit element 14, 17, 21 and 24 can be any conventional circuit able to perform the respective calculation. These circuits are well known in the art.

The new estimate of the long term average energy $E_{mean}'$ 18 is calculated in the circuit element 17 and represents the sum of the weighted estimated long term average energy $E_{mean}$ of the previous frame and the weighted input signal energy $R_0$. The weighting parameter is the averaging constant $\beta$, which controls the relative weight of the two terms of Eq. (1) and determines how quickly new frames are incorporated in the long term average energy $E_{mean}$ calculations. The value of $\beta$ depends on the circuit and is preferably about 0.1. A large value of $\beta$ leads to a faster update of $E_{mean}$ and vice versa. Too large a value of $\beta$ leads to a very fast update of $E_{mean}$, which causes the AGC circuit to quickly react to variations in the input signal, thus leading to distortion. On the other hand, too small a value of $\beta$ leads to very slow update of $E_{mean}$ which results in sluggish response.

The gain change $\epsilon$ is used for adjustment of the estimated gain G. The adjustment may be an increment or a decrement. The gain change $\epsilon$ is represented with the Eq. (3) which has two terms. The first term is $\Delta\gamma_1$ which represents a slew rate of the difference $\Delta$ and provides an adjustment based on a linear function. The second term $\Delta^2\gamma_q$ is based on a square of the first term. Because too small slew value results in sluggish response and too large a value may lead to oscillations, the coefficients $\gamma_1$ and $\gamma_q$ should be set such that the quadratic term practically vanishes during small energy variations, when the linear term keeps track of small energy variations. On the other hand, when there is a large or abrupt change in energy, the quadratic term becomes more important because it adjusts the estimated gain G quickly. It also vanishes quickly as the $E_{mean}$ approaches the target reference energy level $E_{ref}$.

In order to analyze a typical situation in a conventional AGC circuit which leads to oscillations, it can be assumed that initially $E_{mean}$ is not close to $E_{ref}$, leading to a large feedback in estimated gain calculation, as presented in Eq. (4). The estimated gain varies quickly in response to such a large feedback. Because $E_{mean}$ is an average long term energy computed over several frames, the effect of the increased gain will be reflected in $E_{mean}$ several frames later. In the mean time, the difference $\Delta = E_{ref} - E_{mean}$ decreases, although slowly. As a result, the gain continues to increase rapidly in order to make $E_{mean}$ become close to $E_{ref}$. By the time the effect of the increased gain value is fully effecting the $E_{mean}$, the gain has changed too much.

Essentially, the gain G reacts immediately to changes in $E_{mean}$, but the $E_{mean}$ calculation reacts to changes in gain very gradually. This leads to oscillations in the AGC circuit, as illustrated in FIGS. 2 and 3. It can be seen that in a conventional system the estimating gain curve and the long term average energy $E_{mean}$ curve have the same general shape of an oscillation curve, and that $E_{mean}$ curve is lagging the estimated gain curve.

Therefore, there is a need for an AGC circuit with good response time and with good stability.

OBJECTS AND SUMMARY OF THE INVENTION

It is a primary object of the present invention to overcome the aforementioned shortcomings associated with the prior art and provide an AGC circuit with good response time.

Another object of the present invention is to provide an oscillation-free AGC circuit.

These as well as additional objects and advantages of the present invention are achieved in an AGC circuit with a feedback loop which repeatedly adapts the gain and a long term average energy $E_{mean}$ of the output signal to rapidly approach a predetermined level. In each pass through the gain feedback loop the long term average energy $E_{mean}$ is increased by a gain compensation parameter directly proportional to a gain change.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

DETAILED DESCRIPTION OF THE PREFERRED EMBODIMENT

The following description is provided to enable any person skilled in the art to make and use the invention and sets forth the best modes contemplated by the inventor[s] of carrying out [his/her/their] invention. Various modifications, however, will remain readily apparent to those skilled in the art, since the general principles of the present invention have been defined herein specifically to provide AGC circuits with improved response time and stability.

The present invention eliminates the instability problem inherent in the conventional AGC circuits and their algorithm, and provides a more responsive AGC circuit with improved stability. This is accomplished by incorporating the effect of the new gain element G' in the $E_{mean}$' calculation more rapidly. Another way to accomplish this task is to calculate $E_{mean}$' over a shorter period of time, but this may cause the AGC circuit to quickly react to short term variations in the input signal, thus leading to distortions which should be avoided.

Figure 4:
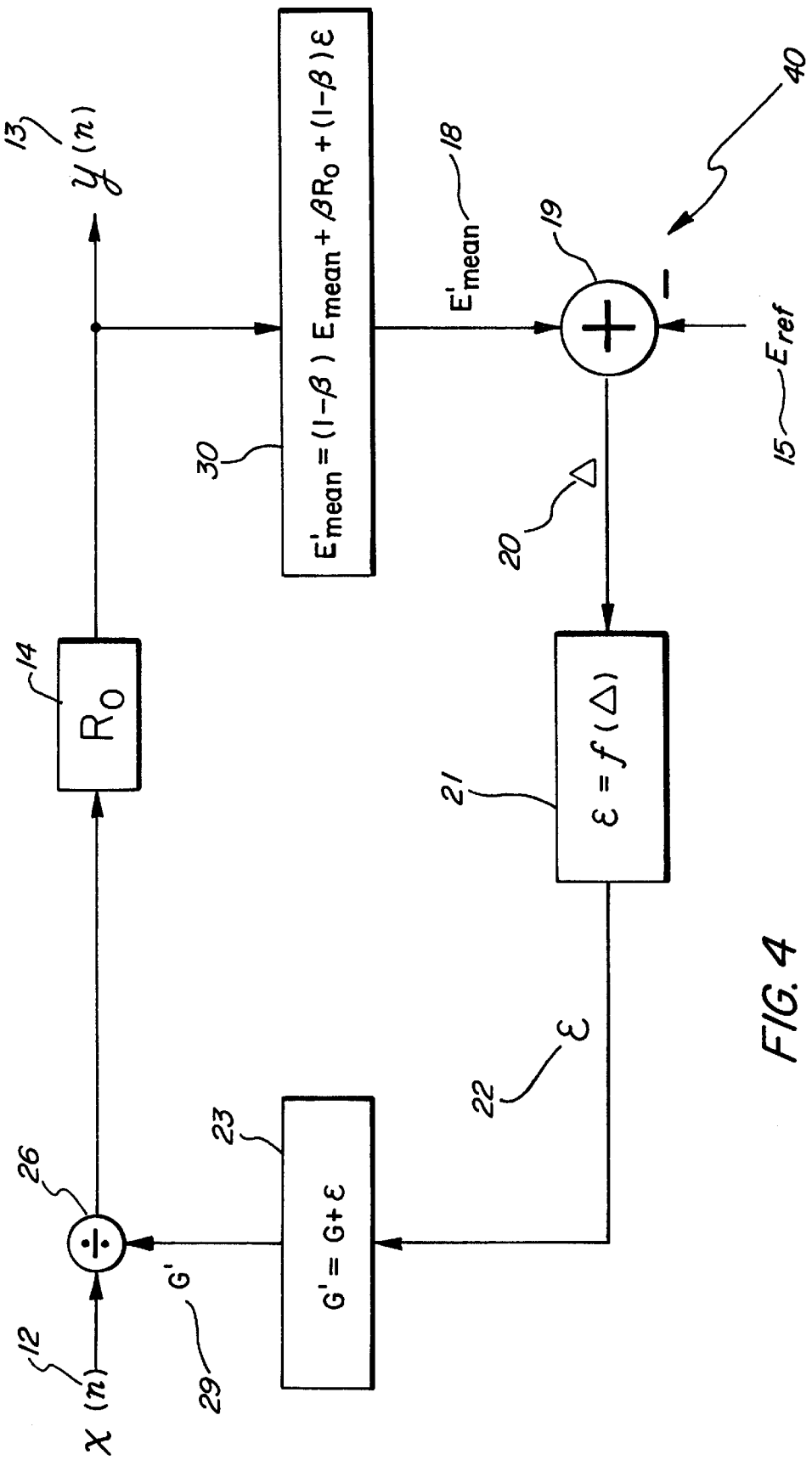
FIG. 4 illustrates a block diagram of an AGC circuit in accordance with the preferred embodiment of the present invention.

The method used in the present invention incorporates the effect of the new gain element G' in the $E_{mean}$' calculation more rapidly, thus speeding up the convergence of the $E_{mean}$ to $E_{ref}$. In this method, the gain change $\epsilon$ is added into the $E_{mean}$ calculation, and multiplied with a scale factor. The new algorithm of the present invention is implemented in FIG. 4 which illustrates a block diagram of an AGC circuit 40 in accordance with the preferred embodiment of the present invention. All the elements of the illustrated preferred embodiment are the same as in FIG. 1 except element 17. The preferred embodiment of FIG. 4 shows element 30, substituted for element 17 of FIG. 1. Element 30 calculates the long term average energy $E_{mean}$' 18 according to the Eq. (5):

$$E_{mean}' = (1-\beta)E_{mean} + \beta R_0 + (1-\beta)\epsilon \tag{5}$$

Therefore, in the present invention, the Eq. (1) is modified to Eq. (5) by adding an additional parameter for gain compensation, $(1-\beta)\epsilon$, and the other three equations are the same. Thus, the gain change $\epsilon$ is added to Eq. (5) directly, not only indirectly as in the Eq. (1). Eq. (1) incorporates the gain change $\epsilon$ only in the second term of the equation, as a function of $\beta$, because it is proportional to a fraction of the frame energy $R_0$ obtained by multiplication with the averaging constant $\beta$. In Eq. (5) the gain compensation element is added where the gain change $\epsilon$ is multiplied with the weight $(1-\beta)$. Since the value of $\beta$ is preferably 0.1, in Eq. (5), $E_{mean}$' changes rapidly because the gain change $\epsilon$ is multiplied with $(1-\beta)$, which is 0.9 and a much higher number than 0.1 used in the Eq. (1). This insures fast convergence of $E_{mean}$ to $E_{ref}$ in the feedback loop 16 of the illustrated embodiment.

The average energy calculation in the illustrated circuit is still calculated over a long time period yet incorporates the changes in the gain almost immediately. Moreover, the third parameter in the Eq. (5) for the gain compensation does not affect the way the variations in the input signal energy are averaged. Furthermore, the AGC circuit of the present invention is oscillation free, because the oscillations in the conventional AGC circuits occur because of the AGC algorithm used in those circuits, and not because of the changes in the input signal.

Figure 1:
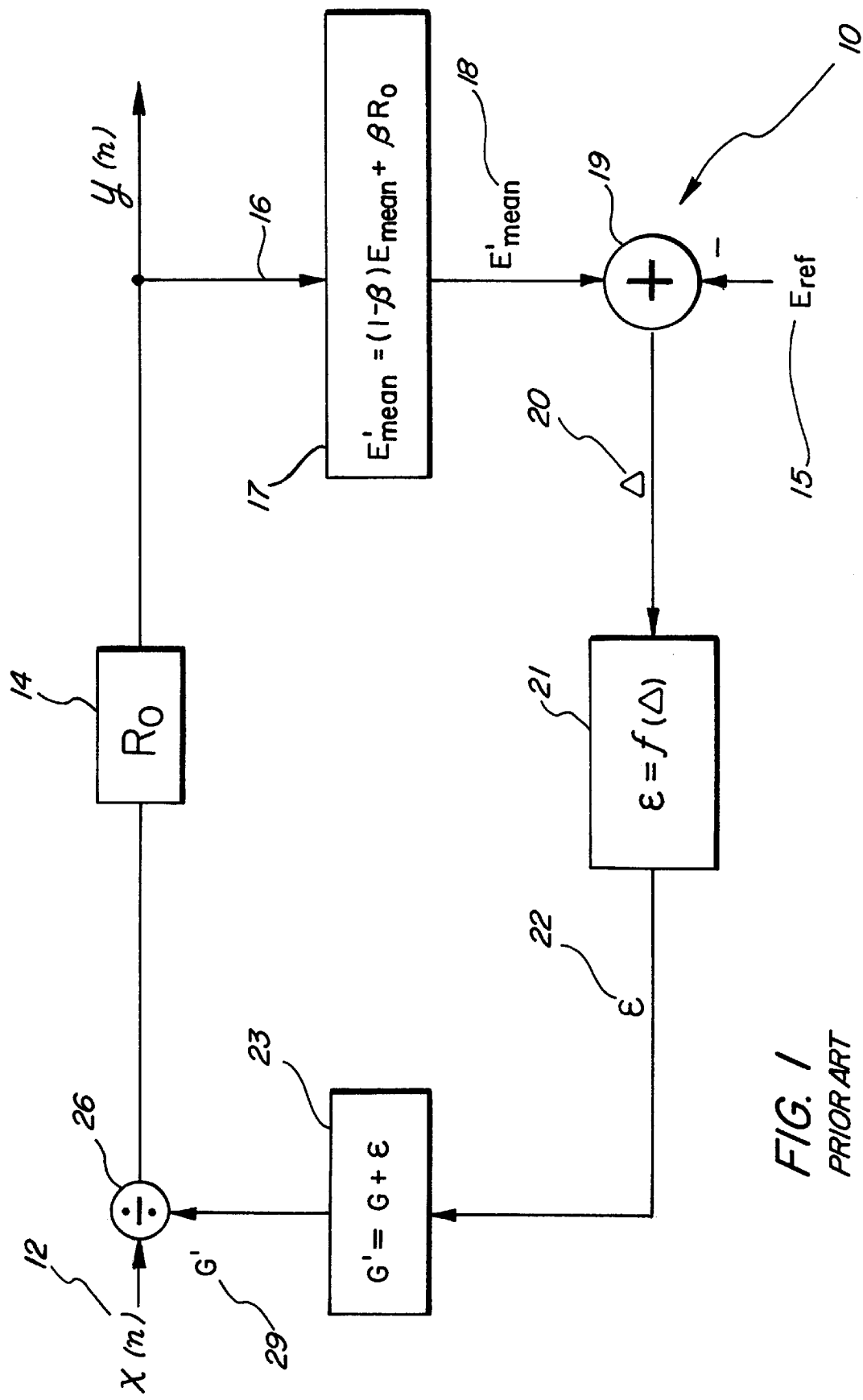
FIG. 1 illustrates a block diagram of a conventional AGC circuit.
Figure 2:
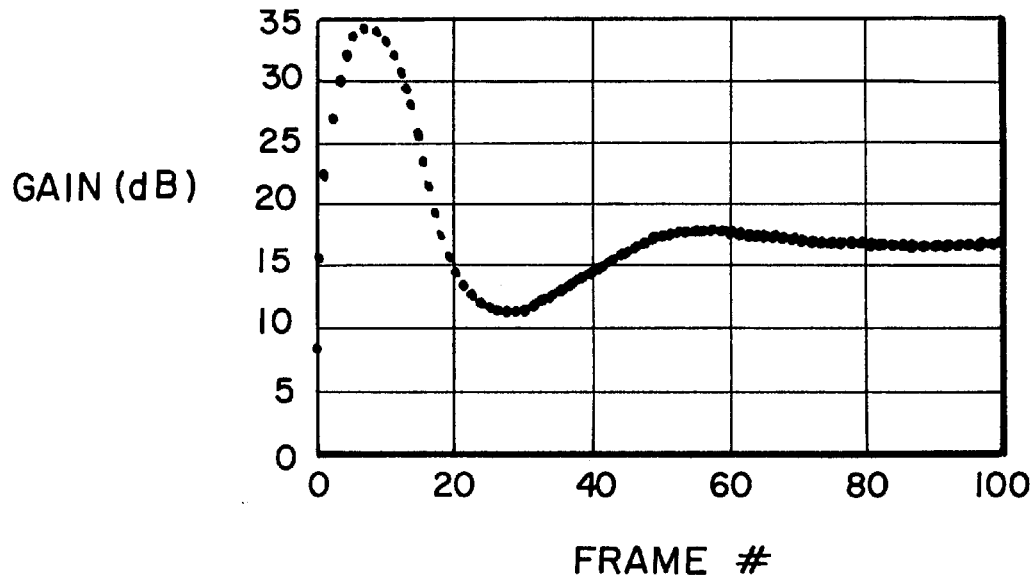
FIG. 2 represents a gain curve obtained with the conventional circuit of FIG. 1.
Figure 3:
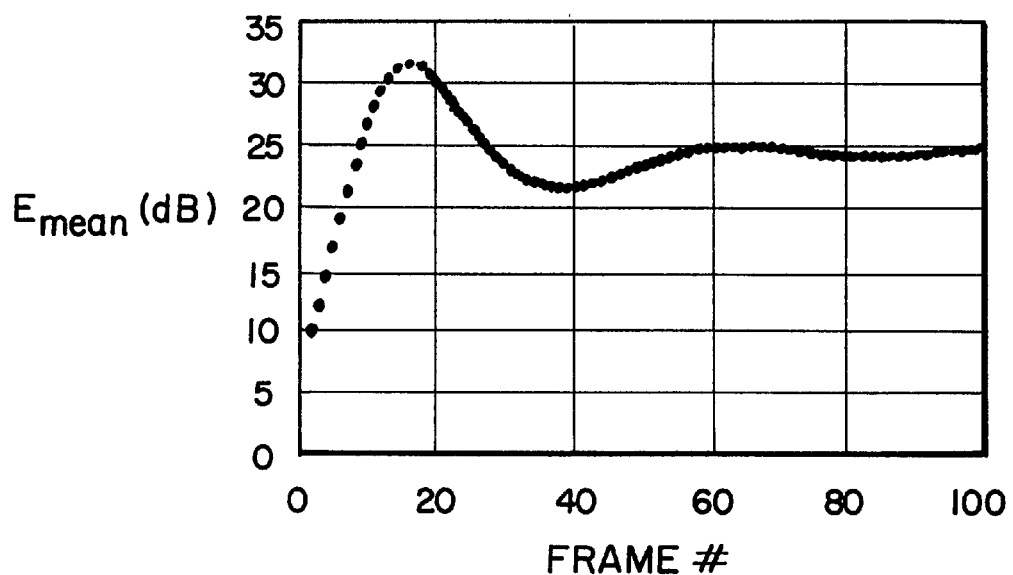
FIG. 3 represents a long term average energy oscillation curve obtained with the conventional circuit of FIG. 1.
Figure 5:
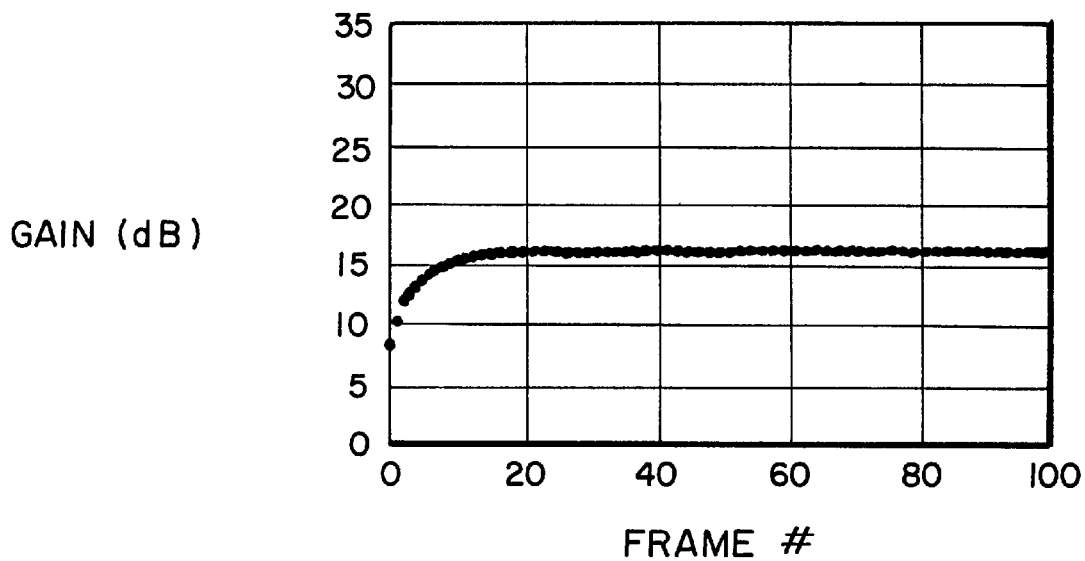
FIG. 5 represents a gain curve obtained with the circuit of FIG. 4.
Figure 6:
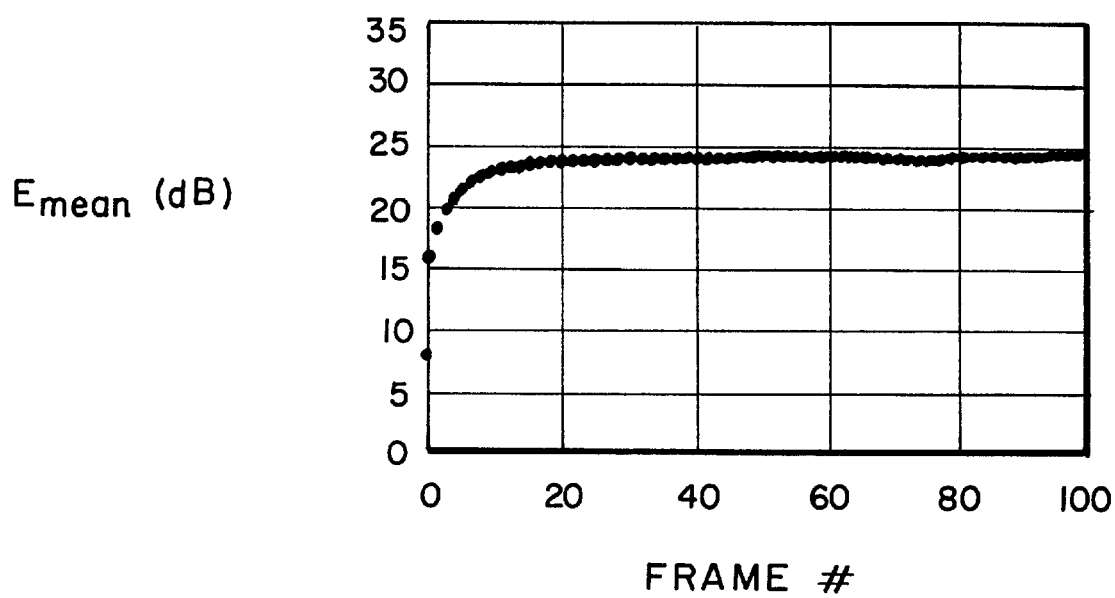
FIG. 6 represents a long term average energy oscillation curve obtained with the circuit of FIG. 4.

The method and AGC circuit of the present invention were evaluated under the same test conditions as the conventional device of FIG. 1. The performance of the AGC circuit of FIG. 4 is shown in FIGS. 5 and 6. In the tests presented with FIGS. 2, 3, 5 and 6 the initial value for the averaging constant $\beta$ was 0.1, the coefficients $\gamma_1$ and $\gamma_q$ were set to 0.100 and 0.025, respectively, $E_{ref}$ was initially set to 24 dB, and $R_0$ was set to 7.7 dB. With the conventional AGC circuit of FIG. 1 the slew rates were not high enough to avoid oscillations, thus leading to a slower response than wanted. With the new algorithm of element 30, slew rates will be able to be set high enough to achieve very fast response, thus eliminating oscillations.

The AGC algorithm and circuit of the present invention is believed to be especially applicable and useful in circuits where the input signal is constantly changing in time and fast response and stability of the system is necessary. It is understood that the principles of this invention may be applied in circuits where input signals are speech patterns, as in digital cordless and cellular telephones, and in digital telephone answering devices.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A highly responsive, oscillation-free AGC circuit, comprising:

an input having a signal applied thereto;

an output providing a signal by multiplying the input signal with a gain; and a gain feedback loop adjusting the gain and average energy $E_{mean}$ of the output signal each time the output signal is passed through the gain feedback loop, by increasing the average energy $E_{mean}$ by a gain compensation parameter directly proportional to a gain change, occurring for each pass through the gain feedback loop.

2. The highly responsive, oscillation-free AGC circuit according to claim 1 wherein:

the average energy $E_{mean}$ of a new pass is adapted according to the equation $$E_{mean} = (1-\beta)E_{mean} + \beta R_0 + (1-\beta)\epsilon$$

using the input signal energy $R_0$ and the $E_{mean}$ from a previous pass, and the gain compensation parameter is directly proportional to the gain change $\epsilon$ and is obtained by multiplying the gain change $\epsilon$ with a scale factor $(1-\beta)$, where $\beta$ is an averaging constant.

3. The AGC circuit of claim 1 wherein the average energy $E_{mean}$ is increased by adding to $E_{mean}$ the gain change multiplied by a scale factor based on an averaging constant.

4. A method for providing highly responsive oscillation-free AGC, the method comprising the steps:

obtaining an input signal to be controlled;

generating an output signal by multiplying the input signal with a gain;

passing the output signal through a feedback circuit a plurality of times until the output signal approaches a predetermined level; and adjusting the gain and a long term average energy $E_{mean}$ of the output signal during each pass through the feedback circuit by increasing the average energy $E_{mean}$ by a gain compensation parameter directly proportional to a gain change, occurring for each pass through the feedback circuit.

5. The method for obtaining a highly responsive oscillation-free AGC circuit according to claim 3, wherein:

the average energy $E_{mean}$, of a new pass is adapted according to the equation $$E_{mean} = (1-\beta)E_{mean} + \beta R_0 + (1-\beta)\epsilon$$

using the input signal energy $R_0$ and the $E_{mean}$ from a previous pass, and the gain compensation parameter is directly proportional to the gain change $\epsilon$ and is obtained by multiplying the gain change $\epsilon$ with a scale factor $(1-\beta)$, where $\beta$ is an averaging constant.

6. The method of claim 4 wherein the average energy $E_{mean}$ is increased by adding to $E_{mean}$ the gain change multiplied by a scale factor based on an averaging constant.

* * * * *